US006911855B2

(12) United States Patent
Yin et al.

(10) Patent No.: US 6,911,855 B2
(45) Date of Patent: *Jun. 28, 2005

(54) CURRENT-CONTROLLED CMOS CIRCUIT USING HIGHER VOLTAGE SUPPLY IN LOW VOLTAGE CMOS PROCESS

(75) Inventors: Guangming Yin, Foothill Ranch, CA (US); Ichiro Fujimori, Irvine, CA (US); Armond Hairapetian, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/177,031

(22) Filed: Jun. 21, 2002

(65) Prior Publication Data

US 2003/0067337 A1 Apr. 10, 2003

Related U.S. Application Data

(63) Continuation-in-part of application No. 09/484,856, filed on Jan. 18, 2000, now Pat. No. 6,424,194.
(60) Provisional application No. 60/141,355, filed on Jun. 28, 1999.

(51) Int. Cl.[7] .............................................. H03K 3/356
(52) U.S. Cl. ...................... 327/210; 327/219; 327/117; 327/119
(58) Field of Search ............................. 327/52, 65, 210, 327/229, 246, 319, 333, 391, 437, 530, 563; 326/80, 81, 108, 115, 119, 121, 122, 127

(56) References Cited

U.S. PATENT DOCUMENTS 4,333,020 A    6/1982  Maeder
4,395,774 A    7/1983  Rapp
4,449,248 A    5/1984  Leslie et al.

(Continued)

FOREIGN PATENT DOCUMENTS

JP         63280517 A      11/1998

OTHER PUBLICATIONS

Buhanan, D. "CML and Flip TAB Join Forces in the DPS 88's Micropackages," *Electronics* Nov. 3, 1982, pp. 93–96.
Chu, K. M. and Pulfrey, D. L. "A Comparison of CMOS Circuit Techniques: Differential Cascade Voltage Switch Logic versus Conventional Logic," *IEEE Journal of Solid–State Circuits* Aug. 1987, pp. 528–532, vol. SC–22, No. 4.
Gray, P. R. and Meyer, R. G. "MOS Amplifier Design," Chapter 12 In *Analysis and Design of Analog Integrated Circuits*. Second Edition, John Wiley & Sons, Inc., NY, 1977, pp. 704–709.

(Continued)

*Primary Examiner*—Timothy P. Callahan
*Assistant Examiner*—Hai L. Nguyen
(74) *Attorney, Agent, or Firm*—Garlick Harrison & Markison LLP; Shayne X. Short

(57) ABSTRACT

Various circuit techniques for implementing ultra high speed circuits use current-controlled CMOS ($C^3MOS$) logic fabricated in conventional CMOS process technology. An entire family of logic elements including inverter/buffers, level shifters, NAND, NOR, XOR gates, latches, flip-flops and the like are implemented using $C^3MOS$ techniques. Optimum balance between power consumption and speed for each circuit application is achieve by combining high speed $C^3MOS$ logic with low power conventional CMOS logic. The combined $C^3MOS$/CMOS logic allows greater integration of circuits such as high speed transceivers used in fiber optic communication systems. The $C^3MOS$ structure enables the use of a power supply voltage that may be larger than the voltage required by the CMOS fabrication process, further enhancing the performance of the circuit.

19 Claims, 8 Drawing Sheets

U.S. PATENT DOCUMENTS

| | | |
|---|---|---|
| 4,519,068 A | 5/1985 | Krebs et al. |
| 4,545,023 A | 10/1985 | Mizzi |
| 4,599,526 A | 7/1986 | Paski |
| 4,649,293 A | 3/1987 | Ducourant |
| 4,680,787 A | 7/1987 | Marry |
| 4,727,309 A | 2/1988 | Vajdic et al. |
| 4,731,796 A | 3/1988 | Masterton et al. |
| 4,737,975 A | 4/1988 | Shafer |
| 4,761,822 A | 8/1988 | Maile |
| 4,777,657 A | 10/1988 | Gillaspie |
| 4,794,649 A | 12/1988 | Fujiwara |
| 4,804,954 A | 2/1989 | Macnak et al. |
| 4,806,796 A | 2/1989 | Bushey et al. |
| 4,807,282 A | 2/1989 | Kazan et al. |
| 4,817,115 A | 3/1989 | Campo et al. |
| 4,850,009 A | 7/1989 | Zook et al. |
| 4,890,832 A | 1/1990 | Komaki |
| 4,894,792 A | 1/1990 | Mitchell et al. |
| 4,916,441 A | 4/1990 | Gombrich |
| 4,964,121 A | 10/1990 | Moore |
| 4,969,206 A | 11/1990 | Desrochers |
| 4,970,406 A | 11/1990 | Fitzpatrick et al. |
| 4,977,611 A | 12/1990 | Maru |
| 4,995,099 A | 2/1991 | Davis |
| 5,008,879 A | 4/1991 | Fischer et al. |
| 5,025,486 A | 6/1991 | Klughart |
| 5,029,183 A | 7/1991 | Tymes |
| 5,031,231 A | 7/1991 | Miyazaki |
| 5,033,109 A | 7/1991 | Kawano et al. |
| 5,041,740 A | 8/1991 | Smith |
| 5,055,659 A | 10/1991 | Hendrick et al. |
| 5,055,660 A | 10/1991 | Bertagna et al. |
| 5,079,452 A | 1/1992 | Lain et al. |
| 5,081,402 A | 1/1992 | Koleda |
| 5,087,099 A | 2/1992 | Stolarczyk |
| 5,115,151 A | 5/1992 | Hull et al. |
| 5,117,501 A | 5/1992 | Childress et al. |
| 5,119,502 A | 6/1992 | Kallin et al. |
| 5,121,408 A | 6/1992 | Cai et al. |
| 5,123,029 A | 6/1992 | Bantz et al. |
| 5,128,938 A | 7/1992 | Borras |
| 5,134,347 A | 7/1992 | Koleda |
| 5,142,573 A | 8/1992 | Umezawa |
| 5,150,361 A | 9/1992 | Wieczorek et al. |
| 5,152,006 A | 9/1992 | Klaus |
| 5,153,878 A | 10/1992 | Krebs |
| 5,175,870 A | 12/1992 | Mabey et al. |
| 5,177,378 A | 1/1993 | Nagasawa |
| 5,179,721 A | 1/1993 | Comroe et al. |
| 5,181,200 A | 1/1993 | Harrison |
| 5,196,805 A | 3/1993 | Beckwith et al. |
| 5,216,295 A | 6/1993 | Hoang |
| 5,230,084 A | 7/1993 | Nguyen |
| 5,239,662 A | 8/1993 | Danielson et al. |
| 5,241,542 A | 8/1993 | Natarajan et al. |
| 5,241,691 A | 8/1993 | Owen |
| 5,247,656 A | 9/1993 | Kabuo et al. |
| 5,249,220 A | 9/1993 | Moskowitz et al. |
| 5,249,302 A | 9/1993 | Metroka et al. |
| 5,265,238 A | 11/1993 | Canova, Jr. et al. |
| 5,265,270 A | 11/1993 | Stengel et al. |
| 5,274,666 A | 12/1993 | Dowdell et al. |
| 5,276,680 A | 1/1994 | Messenger |
| 5,278,831 A | 1/1994 | Mabey et al. |
| 5,289,055 A | 2/1994 | Razavi |
| 5,289,469 A | 2/1994 | Tanaka |
| 5,291,516 A | 3/1994 | Dixon et al. |
| 5,293,639 A | 3/1994 | Wilson et al. |
| 5,296,849 A | 3/1994 | Ide |
| 5,297,144 A | 3/1994 | Gilbert et al. |
| 5,301,196 A | 4/1994 | Ewen et al. |
| 5,323,392 A | 6/1994 | Ishii et al. |
| 5,331,509 A | 7/1994 | Kikinis |
| 5,345,449 A | 9/1994 | Buckingham et al. ...... 370/518 |
| 5,349,649 A | 9/1994 | Iijima |
| 5,361,397 A | 11/1994 | Wright |
| 5,363,121 A | 11/1994 | Freund |
| 5,373,149 A | 12/1994 | Rasmussen |
| 5,373,506 A | 12/1994 | Tayloe et al. |
| 5,390,206 A | 2/1995 | Rein et al. |
| 5,392,023 A | 2/1995 | D'Avello et al. |
| 5,396,128 A * | 3/1995 | Dynning et al. .............. 326/68 |
| 5,399,920 A * | 3/1995 | Van Tran ..................... 326/83 |
| 5,406,615 A | 4/1995 | Miller, II et al. |
| 5,406,643 A | 4/1995 | Burke et al. |
| 5,418,837 A | 5/1995 | Johansson et al. |
| 5,420,529 A | 5/1995 | Guay et al. ................. 326/115 |
| 5,423,002 A | 6/1995 | Hart |
| 5,426,637 A | 6/1995 | Derby et al. |
| 5,428,636 A | 6/1995 | Meier |
| 5,430,845 A | 7/1995 | Rimmer et al. |
| 5,434,518 A | 7/1995 | Sinh et al. |
| 5,438,329 A | 8/1995 | Gastouniotis et al. |
| 5,440,560 A | 8/1995 | Rypinski |
| 5,457,412 A | 10/1995 | Tamba et al. |
| 5,459,412 A | 10/1995 | Mentzer |
| 5,465,081 A | 11/1995 | Todd |
| 5,481,265 A | 1/1996 | Russell |
| 5,481,562 A | 1/1996 | Pearson et al. |
| 5,510,734 A | 4/1996 | Sone .......................... 327/65 |
| 5,510,748 A | 4/1996 | Erhart et al. |
| 5,521,530 A | 5/1996 | Yao et al. |
| 5,533,029 A | 7/1996 | Gardner |
| 5,535,373 A | 7/1996 | Olnowich |
| 5,544,222 A | 8/1996 | Robinson et al. |
| 5,548,230 A | 8/1996 | Gerson et al. |
| 5,559,464 A * | 9/1996 | Orii et al. ................... 327/333 |
| 5,576,644 A | 11/1996 | Pelella |
| 5,579,487 A | 11/1996 | Meyerson et al. |
| 5,584,048 A | 12/1996 | Wieczorek |
| 5,600,267 A | 2/1997 | Wong et al. |
| 5,606,268 A | 2/1997 | Van Brunt |
| 5,625,308 A | 4/1997 | Matsumoto et al. |
| 5,628,055 A | 5/1997 | Stein |
| 5,630,061 A | 5/1997 | Richter et al. |
| 5,640,356 A | 6/1997 | Gibbs |
| 5,675,584 A | 10/1997 | Jeong ......................... 370/284 |
| 5,680,633 A | 10/1997 | Koenck et al. |
| 5,724,361 A | 3/1998 | Fiedler ....................... 307/537 |
| 5,732,346 A | 3/1998 | Lazaridis et al. |
| 5,740,366 A | 4/1998 | Mahany et al. |
| 5,744,366 A | 4/1998 | Kricka et al. |
| 5,767,699 A | 6/1998 | Bosnyak et al. .............. 326/86 |
| 5,796,727 A | 8/1998 | Harrison et al. |
| 5,798,658 A | 8/1998 | Werking ...................... 326/83 |
| 5,821,809 A | 10/1998 | Boerstler et al. |
| 5,839,051 A | 11/1998 | Grimmett et al. |
| 5,877,642 A | 3/1999 | Takahashi |
| 5,892,382 A | 4/1999 | Ueda et al. |
| 5,903,176 A | 5/1999 | Westgate |
| 5,905,386 A | 5/1999 | Gerson |
| 5,940,771 A | 8/1999 | Gollnick et al. |
| 5,945,847 A | 8/1999 | Ransijn |
| 5,945,858 A | 8/1999 | Sato |
| 5,945,863 A | 8/1999 | Coy |
| 5,952,847 A * | 9/1999 | Plants et al. .................. 326/80 |
| 5,969,556 A | 10/1999 | Hayakawa ................... 327/202 |
| 6,002,279 A | 12/1999 | Evans et al. |
| 6,014,041 A | 1/2000 | Somasekhar et al. |
| 6,014,705 A | 1/2000 | Koenck et al. |
| 6,028,454 A | 2/2000 | Elmasry et al. |

| | | | |
|---|---|---|---|
| 6,037,841 A | 3/2000 | Tanji et al. | |
| 6,037,842 A | 3/2000 | Bryan et al. | |
| 6,038,254 A | 3/2000 | Ferraiolo et al. | 375/232 |
| 6,061,747 A | 5/2000 | Ducaroir et al. | 710/21 |
| 6,064,229 A * | 5/2000 | Morris | 326/81 |
| 6,081,162 A | 6/2000 | Johnson | |
| 6,094,074 A | 7/2000 | Chi et al. | 326/115 |
| 6,099,100 A * | 8/2000 | Lee | 326/81 |
| 6,104,214 A | 8/2000 | Ueda et al. | |
| 6,111,425 A * | 8/2000 | Bertin et al. | 326/21 |
| 6,114,843 A | 9/2000 | Olah | |
| 6,188,339 B1 | 2/2001 | Hasegawa | 341/101 |
| 6,194,950 B1 | 2/2001 | Kibar et al. | 327/410 |
| 6,222,380 B1 | 4/2001 | Gerowitz et al. | 326/38 |
| 6,232,844 B1 | 5/2001 | Talaga, Jr. | |
| 6,242,949 B1 * | 6/2001 | Wilford | 326/81 |
| 6,259,312 B1 | 7/2001 | Murtojarvi | |
| 6,265,898 B1 | 7/2001 | Bellaouar | 326/93 |
| 6,310,501 B1 | 10/2001 | Yamashita | |
| 6,374,311 B1 | 4/2002 | Mahany et al. | |
| 6,424,194 B1 | 7/2002 | Hairapetian | |
| 6,463,092 B1 | 10/2002 | Kim et al. | 327/219 |

OTHER PUBLICATIONS

Harrold, S. J. "Source–Coupled FET Logic (SCFL) [29], " Chapter 3.5 *In An Introuduction to GaAs IC Design.* 1993, Prentice Hall International Ltd., UK, pp. 43–45, 63, & 160.

Heller, L. G. and Griffin, W. R. "Cascade Voltage Switch Logic: A Differential CMOS Logic Family," *IEEE International Solid–State Circuits Conference* Feb. 22, 1984, pp. 16–17.

Hodges, D. A. and Jackson, H. G. "Emitter–Coupled Logic," Chapter 7.4 *In Analysis and Design of Digital Integrated Circuits.* McGraw Hill, Inc., NY, 1993, pp. 271–283.

Katsu, S. et al. "A Source Coupled FET Logic–A New Current–Mode Approach to GaAs Logics," *IEEE Transactions on Electron Devices* Jun. 1985, pp. 1114–1118, vol. ED–32, No. 6.

Katsu, S. et al. "A GaAs Monolithic Frequency Divider Using Source Coupled FET Logic," *IEEE Electron Device Letters* Aug. 1982, pp. 197–199, vol. EDL–3, No. 8.

Pfennings, L. C. M. G. et al. "Differential Split–Level CMOS Logic for Subnanosecond Speeds," *IEEE Journal of Solid–State Circuits* Oct. 1985, pp. 1050–1055, vol. SC–20, No. 5.

Somasekhar, D. and Kaushik, R. "Differential Current Switch Logic a power DCVS Logic Family," *IEEE Journal of Solid–State Circuits* Jul. 1996, pp. 981–991, vol. 31, No. 7.

Yamashina, M. and Yamada, H. "An MOS Current Mode Logic (MCML) Circuit for Low–Power Sub–GHz Processors," *IEICE Trans. Electron.* Oct. 1992, pp. 1181–1187, vol. E75–C, No. 10.

Yamashina, M. et al. "A Low–supply Voltage GHz MOS Integrated Circuit for Mobile COmputing System," *IEEE Symposium on Low Power Electronics* 1994, pp. 80–81.

Yamashina, M. and Yamada, H. "An MOS Current Mode Logic (MCML) Circuit for Low–Power GHz Processors," *NEC Res. & Develop.* Jan. 1995. pp. 54–63, vol. 36, No. 1.

Lee, T. H. "High–Frequency Amplifier Design," Chapter 8 *In The Design of CMOS Radio–Frequency Integrated Circuits.* 1998, Cambridge University Press, Cambridge, UK, pp. 178–185.

Rudell, J. C. et al. "A 1.9–GHz Wide–Band IF Double Conversion CMOS Receiver for Cordless Telephone Applications," *IEEE Journal of Solid–State Circuits* Dec. 1997, pp. 2071–2088, vol. 32, No. 12.

Mizuno, et al., "A GHz MOS Adaptive Pipeline Technique Using Mos Current–Mode Logic," *IEEE Journal of Solid–State Circuits*, vol. 31, No. 6, pp. 784–791, (Jun. 1996).

Bida, A Hybrid Wireless MAC Protocol Supporting Asynchronous and Synchronous MSDU Delivery Services, IEEE 802. 11/91–92, Sep. 1991, pp. 1–46.

Robert Meier's Master's Thesis, Mobile Computer Network Architecture, (May 1993), 82 pages.

Hoberecht, A Layered network Protocol for Packet Voice and Data Integration, IEEE Journal on Selected Areas in Communications, vol. SAC–1, No. 6 (Dec. 1983), pp. 1006–1013.

Rypinski, Architecture–Topology and Protocol Stacks, IEEE 802. 11/91–21, Mar. 1991, 12 pages.

Cheah, A Proposed Architecture and Access Protocol Outline for the IEEE 802.11 Radio LAN Standards, Document IEEE P802. 11/91–54, May 1991; pages 1–20.

Rypinski, Power–Drain Considerations for Full Time and Sleep Mode Radio Receivers, IEEE P802.11/91–99, Sep. 1991, 11 pages.

Natarajan et al, Battery Effcient Operation of Radio MAC Protocol, IEEE P802.11/91–102, Sep. 1991, pages 1–5.

Cox, A Radio System Proposal for Widespread Low–Power Tetherless Communications, IEEE Transactions on Communications, vol. 39, No. 2 (Feb. 1991), pages 324–335.

Bagby, One Approach to Wireless Network Architecture, IEEE P802.11/91–2, Jan. 1991, 1–15, 17–21.

Biba, A Modest Proposal for a Asynchronous, Data Intensive, Wireless Local Area Network, IEEE P802.11/91–25, Mar. 1991; pages 1–25.

Heimschi et al; Merged CMOS/Biopolar Current Switch Logic (MCSL), IEEE Journal of Solid State Circuits, vol. 24, pp. 1307–11, Oct. 1989, pp. 1307–1311.

Elrabaa et al; Optimization of Digital BiCMOS Circuits, An Overview, IEEE 1992, 5 pages.

Mudd et al, Very High Speed ECL/CMG Gate Arrays with Submicron Structures; IEEE 1989, 5 pages.

Atkinson, A Single Chip Radio Transceiver for DECT, IEEE 1997.

Mizuno, A GHzMOS Adaptive Pipeline Technique Using MOS Curren–Mode Logic, IEEE Journal of Solid–State Circuits, vol. 31, No. 6, pp 784–791 (Jun. 1996).

Klose, Process–Optimization for Sub–3Ops BICMOS Technologies for Mixed ECL/CMOS Applications, IEEE 1991.

Heimsch, Merged CMOS/Bipolar Current Switch Logic (MCSL), IEEE Journal of Solid–State Circuits, vol. 24, No. 5, pp. 1307–11 (Oct. 1989).

Elrabaa, Optimization of Digital BICMOS Circuit, An Overview, IEEE 1992.

Elrabaa, Multimitter BICMOS CML Circuits, IEEE Journal of Solid–State Circuits, vol. 27, No. 3, pp. 454–458 (Mar. 1992).

Ewen et al., Single–Chip 1082Mbaud CMOS Transceiver for Serial Data Communication, 1995 IEEE International Solid–State Circuits Conference Digest of Technical Papers, pp. 32–33, 336.

Chen and Waldron, A Single–Chip 266Mb/s CMOS Transmitter/Receiver for Serial Data Communications, 1993 IEEE International Solid–State Circuits Conference Digest of Technical Papers, pp 100–01, 269.

Oshima et al., A Single CMOS SDH Terminal Chip for 622 Mb/s STM 4C, 1994 IEEE International Solid–State Circuits Conference Digest of Technical Papers, pp. 174–75.

Widmer et al., Single–Chip 4x500Mbaud CMOS Transceiver, 1996 IEEE International Solid–State Circuits Conference Digest of Technical Papers, pp. 126–27, 430.

Lee et al., A CMOS Serial Link for 1 Gbaud Fully Duplexed Data Communication, 1994 Symposium on VLSI Circuits Digest of Technical Papers, pp. 125–26.

Lee et al., A CMOS Serial Link for Fully Duplexed Data Communication, IEEE Journal of Solid–State Circuits, vol. 30, pp. 353–364 (Apr. 1995).

Djahanshahi et al., High–speed ECL–Compatible Serial. 1/0 in 0.35µm CMOS, IEEE 1998.

Fukaishi et al., A 4.25–Gb/s CMOS Fiber Channel Transceiver with Asynchronous Tree–Type Demultiplexer and Frequency Conversion Architecture, IEEE Journal of Solid–state Circuits, vol. 33 No. 12, pp. 2139–47 (1998).

Madhaven and Levi, Low–Power 2.5 Gbit/s VCSEL driver in 0.5µm CMOS technology, Electronics Letters, vol. 34 No. 2 pp. 178–79 (Jan. 1998).

Chen and Baker, A 1.25Gb/s, 460mW CMOS Transceiver for Serial Data Communication, 1997 IEEE International Solid–State Circuits Conference pp. 242–43, 465.

Runge and Thomas, 5Gbit/s 2:1 multiplexer fabricated in 0.35µm CMOS and 3Gbit/s 1:2 demultiplexer fabricated in 0.5µm CMOS technology, Electronics Letters, vol. 35 No. 19 pp. 163 1–33 (Sep. 1999).

Fiedler et al., A 1.0625Gbps Transceiver with 2x–Oversampling and Transmit Signal Pre–Emphasis, 1997 IEEE International Solid–state Circuits Conference pp. 238–39, 464.

Widmer et al., Single–Chip 4 x 500–MEd CMOS Transceiver, IEEE Journal of Solid–state Circuits, vol. 31 No. 12 pp. 2004–14 (1996).

Kurisu et al., 2.8Gb/s 176mW Byte–Interieaved and 3.0 Gb/s 118mW Bit–Interleaved 8:1 Multiplexers, 1996 International Solid state Circuits Conference pp. 122–23, 429.

Friedman et al, A Baseband Processor for IS–54 Cellular Telephony, IEEE Journal of Solid–state Circuits, vol. 31 No. 5 pp.646–55 (May 1996).

Ewen et al., CMOS circuits for Gb/s serial data communication, IBM J. Res. Develop., vol. 39 No. 12 pp. 73–81 (Mar. 1995).

Thompson et al., A 300–MHz BICMOS Serial Data Transceiver, IEEE Journal of Solid–state Circuits, vol. 29 No. 3 pp. 185–92 (1994).

Yuen et al., An ECL Gate Array with 2.5 GHz Embedded PLL, IEEE 1993.

Quigley et al., Current Mode Transceiver Logic, (CMTL) for Reduced Swing CMOS, Chip to Chip Communication, IEEE 1993.

Dunlop et al., A 9 Gbit/s Bandwidth MultiplexerfDemultiplexer CMOS Chip, 1992 Symposium on VLSI Circuits Digest of Technical Papers pp. 68–69.

Navarro and Van Noije, Design of an 8:1 MUX at 1.7Gbit/s in 0.8µm CMOS Technology, 1998 Great Lakes Symposium on VLSI.

Pederson and Metz, A CMOS to 100K ECL Interface Circuit, 1989 IEEE International Solid–state Circuits Conference pp. 226–27, 345.

Baumert et al., A Monolithic 50–200 MHz CMOS Clock Recovery and Retiming Circuit, IEEE 1989 Custom Integrated Circuits Conference pp. 14.5. 1–14.5.4. (May 1989).

* cited by examiner

CURRENT-CONTROLLED CMOS CIRCUIT USING HIGHER VOLTAGE SUPPLY IN LOW VOLTAGE CMOS PROCESS

CROSS-REFERENCES TO RELATED APPLICATIONS

This application is a Continuation-in-Part of U.S. patent application Ser. No. 09/484,856, filed Jan. 18, 2000, now U.S. Pat. No. 6,424,194 B1, which claims priority from U.S. Provisional Patent Application No. 60/141,355, filed Jun. 28, 1999, the disclosures of which are each incorporated herein by reference for all purposes.

BACKGROUND OF THE INVENTION

The present invention relates in general to integrated circuitry, and in particular to complementary metal-oxide-semiconductor (CMOS) logic and circuits with enhanced speed characteristics.

For a number of reasons CMOS is the logic family of choice in today's VLSI devices. Due to the complementary nature of its operation, CMOS logic consumes near zero static power. CMOS also readily scales with technology. These two features are highly desirable given the drastic growth in demand for low power and portable electronic devices. Further, with the computer aided design (CAD) industry's focus on developing automated design tools for CMOS based technologies, the cost and the development time of CMOS VLSI devices has reduced significantly.

The one drawback of the CMOS logic family, however, remains its limited speed. That is, conventional CMOS logic has not achieved the highest attainable switching speeds made possible by modem sub-micron CMOS technologies. This is due to a number of reasons. Referring to FIG. 1, there is shown a conventional CMOS inverter 100—the most basic building block of CMOS logic. A p-channel transistor 102 switches between the output and the positive power supply Vcc, and an n-channel transistor 104 switches between the output and the negative power supply (or ground). The switching speed in CMOS logic is inversely proportional to the average on resistance (Ron) of the MOS transistor, and the load capacitance CL on a given node ($\tau = Ron \times C_L$). The on resistance Ron is proportional to the transistor channel length L divided by the power supply voltage (i.e., Ron $\alpha$ L/Vcc), while the load capacitance is given by the gate capacitance of the transistor being driven (i.e., W×L×Cox, where Cox is the gate oxide capacitance), plus the interconnect parasitic capacitance Cint. Therefore, with reduced transistor channel lengths L, the switching speed is generally increased.

This relationship, however, no longer holds in sub-micron technologies. As the channel length L in CMOS technology shrinks into the sub-micron range, the power supply voltage must be reduced to prevent potential damage to the transistors caused by effects such as oxide breakdown and hot-electrons. The reduction of the power supply voltage prevents the proportional lowering of Ron with the channel length L. Moreover, the load capacitance which in the past was dominated by the capacitances associated with the MOS device, is dominated by the routing or interconnect capacitance ($C_{int}$) in modem sub 0.5 micron technologies. This means that the load capacitance will not be reduced in proportion with the channel length L. Thus, the RC loading which is the main source of delaying the circuit remains relatively the same as CMOS technology moves in the sub-micron range.

Furthermore, modem sub-micron CMOS process technologies such as a 0.13$\mu$ process, require lower power supply voltages (e.g., 1.2 volts) for reliability concerns. The lower power supply voltages, which are characteristic of these sub-micron CMOS processes, limit the current density or the transconductance of the MOS transistor rendering the devices even slower.

As a result of the speed limitations of conventional CMOS logic, integrated circuit applications in the Giga Hertz frequency range have had to look to alternative technologies such as ultra high speed bipolar circuits and Gallium Arsenide (GaAs). These alternative technologies, however, have drawbacks of their own that have made them more of a specialized field with limited applications as compared to silicon MOSFET that has had widespread use and support by the industry. In particular, compound semiconductors such as GaAs are more susceptible to defects that degrade device performance, and suffer from increased gate leakage current and reduced noise margins. Furthermore, attempts to reliably fabricate a high quality oxide layer using GaAs have not thus far met with success. This has made it difficult to fabricate GaAs FETs, limiting the GaAs technology to junction field-effect transistors (JFETs) or Schottky barrier metal semiconductor field-effect transistors (MESFETs). A major drawback of the bipolar technology, among others, is its higher current dissipation even for circuits that operate at lower frequencies.

It is therefore highly desirable to develop integrated circuit design techniques that are based on conventional silicon CMOS technology, but overcome the speed limitations of CMOS logic.

BRIEF SUMMARY OF THE INVENTION

The present invention provides a new family of CMOS logic that is based on current-controlled mechanism to maximize speed of operation. The current-controlled CMOS (or C³MOS™) logic family according to the present invention includes all the building blocks of any other logic family. The basic building block of the C³MOS logic family uses a pair of conventional MOSFETs that steer current between a pair of load devices in response to a difference between a pair of input signals. Thus, unlike conventional CMOS logic, C³MOS logic according to this invention dissipates static current, but operates at much higher speeds. The structure of a typical C³MOS logic block according to the present invention stacks more than a couple of devices between the power supplies. This extends the power supply range of the circuit allowing it to operate at a supply voltage that can be higher than the voltage the CMOS process can tolerate. The higher power supply voltage further enhances the speed of the circuit. In one embodiment, the present invention combines C³MOS logic with CMOS logic within the same integrated circuitry, where C³MOS is utilized in high speed sections and CMOS is used in the lower speed parts of the circuit. In another embodiment, a higher power supply voltage is used for the C³MOS section of the circuit while a lower power supply voltage is used for the conventional CMOS logic circuitry.

Accordingly, in one embodiment, the present invention provides a metal-oxide-semiconductor field-effect transistor (MOSFET) circuit fabricated on a silicon substrate, comprising: first circuitry implemented using current-controlled complementary metal-oxide semiconductor C³MOS logic wherein logic levels are signaled by current steering in one of two or more branches in response to differential input signals, the first circuitry being configured to process a first signal having a first frequency; and second circuitry implemented using conventional complementary metal-oxidesemiconductor (CMOS) logic wherein substantially zero static current is dissipated, the second circuitry being coupled to the first circuitry and configured to process a second signal having a second frequency that is different than the first frequency, wherein the first circuitry is coupled to a first power supply voltage and the second circuitry is coupled to a second power supply voltage that is different than the first power supply voltage.

In a specific implementation of the above embodiment, the first power supply voltage is higher in magnitude than the second power supply voltage. In yet another specific implementation, the second power supply voltage is the maximum power supply voltage specified by CMOS process used to fabricate the circuit. In another specific embodiment, the second power supply voltage is generated on-chip from the first power supply voltage. In this embodiment the circuit further includes a voltage generator that is configured to receive the first power supply voltage and to generate the second power supply voltage.

The following detailed description with the accompanying drawings provide a better understanding of the nature and advantages of the current-controlled CMOS logic according to the present invention.

DETAILED DESCRIPTION OF THE INVENTION

The present invention provides ultra high-speed logic circuitry implemented in silicon complementary metal-oxide-semiconductor (CMOS) process technology. A distinction is made herein between the terminology "CMOS process technology" and "CMOS logic." CMOS process technology as used herein refers generally to a variety of well established CMOS fabrication processes that form a field-effect transistor over a silicon substrate with a gate terminal typically made of polysilicon material disposed on top of an insulating material such as silicon dioxide. CMOS logic, on the other hand, refers to the use of complementary CMOS transistors (n-channel and p-channel) to form various logic gates and more complex logic circuitry, wherein zero static current is dissipated. The present invention uses current-controlled mechanisms to develop a family of very fast current-controlled CMOS (or C³MOS™) logic that can be fabricated using a variety of conventional CMOS process technologies, but that unlike conventional CMOS logic does dissipate static current. C³MOS logic or current-controlled metal-oxide-semiconductor field-effect transistor (MOSFET) logic are used herein interchangeably.

Figure 2:
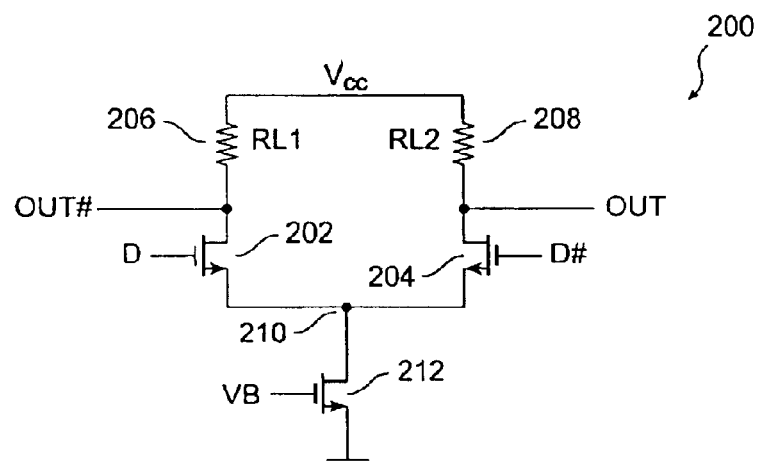
FIG. 2 is an inverter/buffer implemented in C³MOS according to an exemplary embodiment of the present invention.

In a preferred embodiment, the basic building block of this logic family is an NMOS differential pair with resistive loads. Referring to FIG. 2, there is shown one embodiment for the basic C³MOS inverter/buffer 200 according to the present invention. Inverter/buffer 200 includes a pair of n-channel MOSFETs 202 and 204 that receive differential logic signals D and D# at their gate terminals, respectively. Resistive loads 206 and 208 connect the drain terminals of MOSFETs 202 and 204, respectively, to the power supply Vcc. Drain terminals of MOSFETs 202 and 204 form the outputs OUT# and OUT of the inverter/buffer, respectively. Resistive loads 206 and 208 may be made up of either p-channel MOSFETs operating in their linear region, or resistors made up of, for example, polysilicon material. In a preferred embodiment, polysilicon resistors are used to implement resistive loads 206 and 208, which maximizes the speed of inverter/buffer 200. The source terminals of n-channel MOSFETs 202 and 204 connect together at node 210. A current-source n-channel MOSFET 212 connects node 210 to ground (or negative power supply). A bias voltage VB drives the gate terminal of current-source MOSFET 212 and sets up the amount of current I that flows through inverter/buffer 200. In response to the differential signal at D and D#, one of the two input n-channel MOSFETs 202 and 204 switches on while the other switches off. All of current I, thus flows in one leg of the differential pair pulling the drain terminal (OUT or OUT#) of the on transistor down to logic low, while the drain of the other (off) transistor is pulled up by its resistive load toward logic high. At the OUT output this circuit is a buffer, while at the OUT# output the circuit acts as an inverter.

Figure 1:
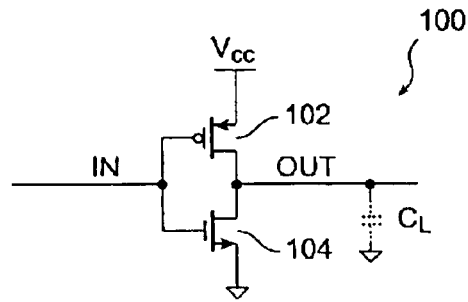
FIG. 1 shows a conventional CMOS inverter.

Significant speed advantages are obtained by this type of current steering logic. Unlike the conventional CMOS inverter of FIG. 1, when either one of the input MOSFETs 202 or 204 is switching on, there is no p-channel pull-up transistor that fights the n-channel. Further, circuit 200 requires a relatively small differential signal to switch its transistors. This circuit also exhibits improved noise performance as compared to the CMOS inverter of FIG. 1, since in the C3MOS inverter/buffer, transistors do not switch between the power supply and the substrate. Logic circuitry based on current-steering techniques have been known in other technologies such as bipolar, where it is called emitter-coupled logic (ECL), and GaAs where it is called source-coupled FET logic (SCFL). This technique, however, has not been seen in silicon CMOS technology for a number of reasons, among which is the fact that CMOS logic has always been viewed as one that dissipates zero static current. The C³MOS logic as proposed by the present invention, on the other hand, does dissipate static current.

The design of each C³MOS logic cell according to the present invention is optimized based on several considerations including speed, current dissipation, and voltage swing. The speed of the logic gate is determined by the resistive load and the capacitance being driven. As discussed above, the preferred embodiment according to the present invention uses polysilicon resistors to implement the load devices. P-channel MOSFETs can alternatively be used, however, they require special biasing to ensure they remain in linear region. Further, the junction capacitances of the p-channel load MOSFETs introduce undesirable parasitics. Speed requirements place a maximum limit on the value of the resistive loads. On the other hand, the various C³MOS logic cells are designed to preferably maintain a constant voltage swing (I×R). Accordingly, the values for R and I are adjusted based on the capacitive load being driven to strike the optimum trade-off between switching speed and power consumption.

Figure 3:
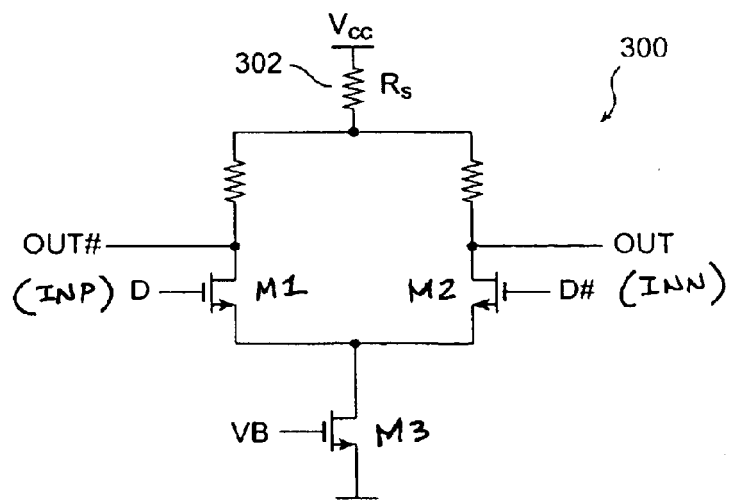
FIG. 3 shows an exemplary C³MOS level shift buffer according to the present invention.

The C³MOS logic family, according to the present invention, contains all the building blocks of other logic families. Examples of such building blocks include inverters, buffers, level shift buffers, N-input NOR and NAND gates, exclusive OR (XOR) gates, flip flops and latches, and the like. FIG. 3 shows an exemplary C3MOS level shift circuit 300 according to the present invention. Level shift circuit 300 includes essentially the same circuit elements as inverter/buffer 200 shown in FIG. 2, with an additional resistor Rs 302 inserted between the power supply Vcc and the load resistors. Circuit 300 operates in the same fashion as inverter/buffer 200 except that it has its power supply voltage shifted by a value equal to (I□Rs). The C³MOS logic circuitry according to the present invention employs this type of level shifter to make the necessary adjustments in the signal level depending on the circuit requirements. Examples of C³MOS circuits utilizing this type of level shifting will be described below in connection with other types of C³MOS logic elements.

Figure 4A:
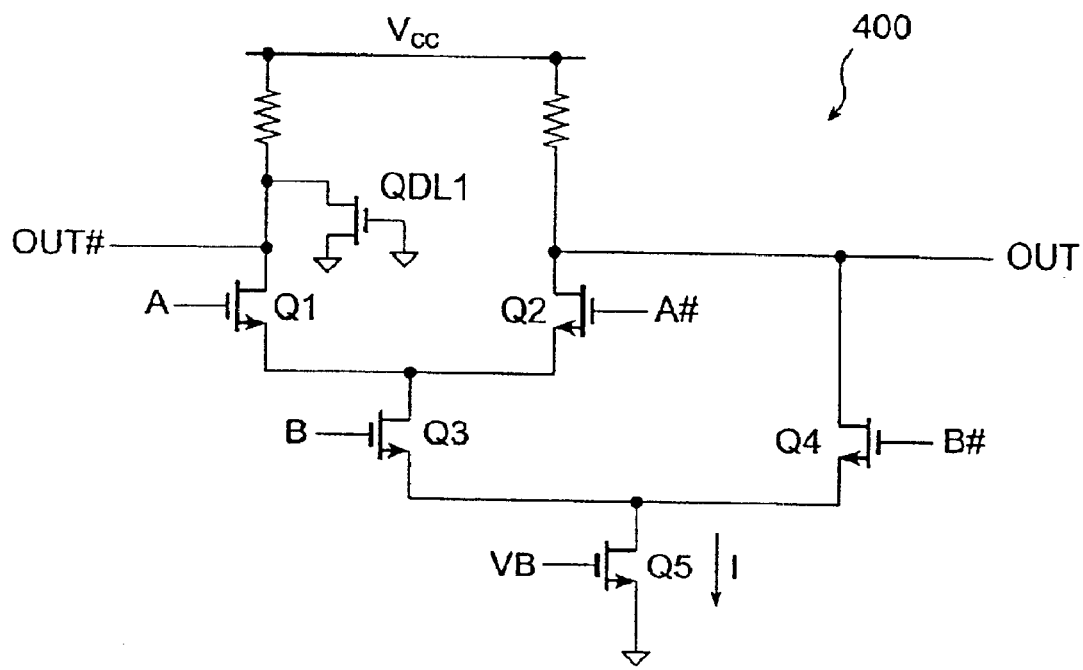
FIGS. 4A and 4B show exemplary C³MOS implementations for an AND/NAND gate and an OR/NOR gate, respectively.
Figure 4B:
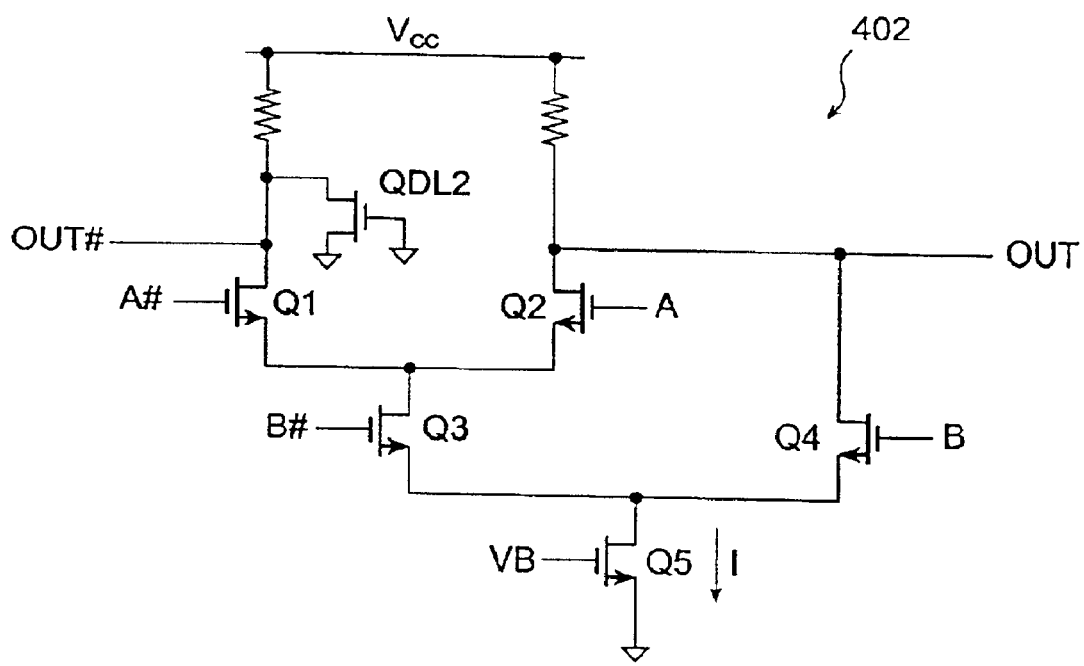

FIGS. 4A and 4B show exemplary C³MOS implementations for an exemplary 2-input AND/NAND gate 400 and an exemplary 2-input OR/NOR gate 402, respectively. These gates operate based on the same current steering principal as discussed above. A logic low signal at input B of AND/NAND gate 400 brings OUT to ground via Q4 while OUT# is pulled high by its load resistor. A logic low at the A input also pulls OUT to ground via Q2 and Q3 (B=high). OUT is pulled high only when both A and B are high disconnecting any path to ground. OUT# provides the inverse of OUT. OR/NOR gate 402 operates similarly to generate OR/NOR logic at its outputs. When another set of transistors are inserted in each leg of the differential pair as is the case for gates 400 and 402, the signals driving the inserted transistors (Q3, Q4) need level shifting to ensure proper switching operation of the circuit. Thus, high speed C³MOS level shifters such as those presented in FIG. 3 can be employed to drive signals B and B#. In a preferred embodiment, since node OUT in both gates 400 and 402 must drive the additional parasitics associated transistors Q4, dummy load transistors DQL1 and DQL2 connect to node OUT# to match the loading conditions at both outputs. The gate and source terminals of the dummy transistors can be either connected to ground as shown, or connected to some other voltage depending on the circuit and process voltage requirements.

Figure 5:
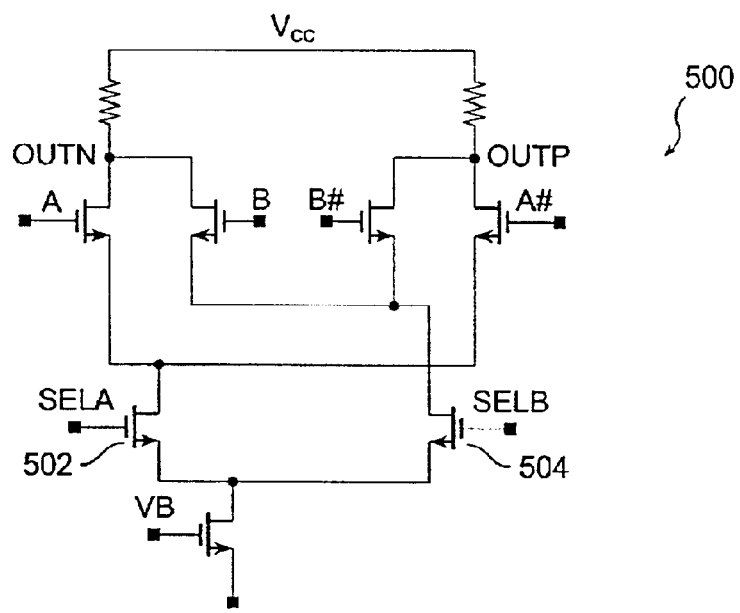
FIG. 5 shows an exemplary C³MOS implementation for a 2:1 multiplexer.

FIG. 5 shows an exemplary C³MOS implementation for a 2:1 multiplexer 500. Similar to the other C³MOS logic gates, multiplexer 500 includes a differential pair for each input, but multiplexer 500 further includes select transistors 502 and 504 inserted between the common source terminals of the differential pairs and the current source transistor in a cascode structure. By asserting one of the select input signals SELA or SELB, the bias current is steered to the differential pair associated with that select transistor. Thus, signal SELA steers the bias current to the differential pair with A and A# inputs, and signal SELB steers the bias current to the differential pair with B and B# inputs. Similar to gates 400 and 402, the signals SELA and SELB driving inserted transistors 502 and 504 need level shifting to ensure proper switching operation of the circuit.

Figure 6:
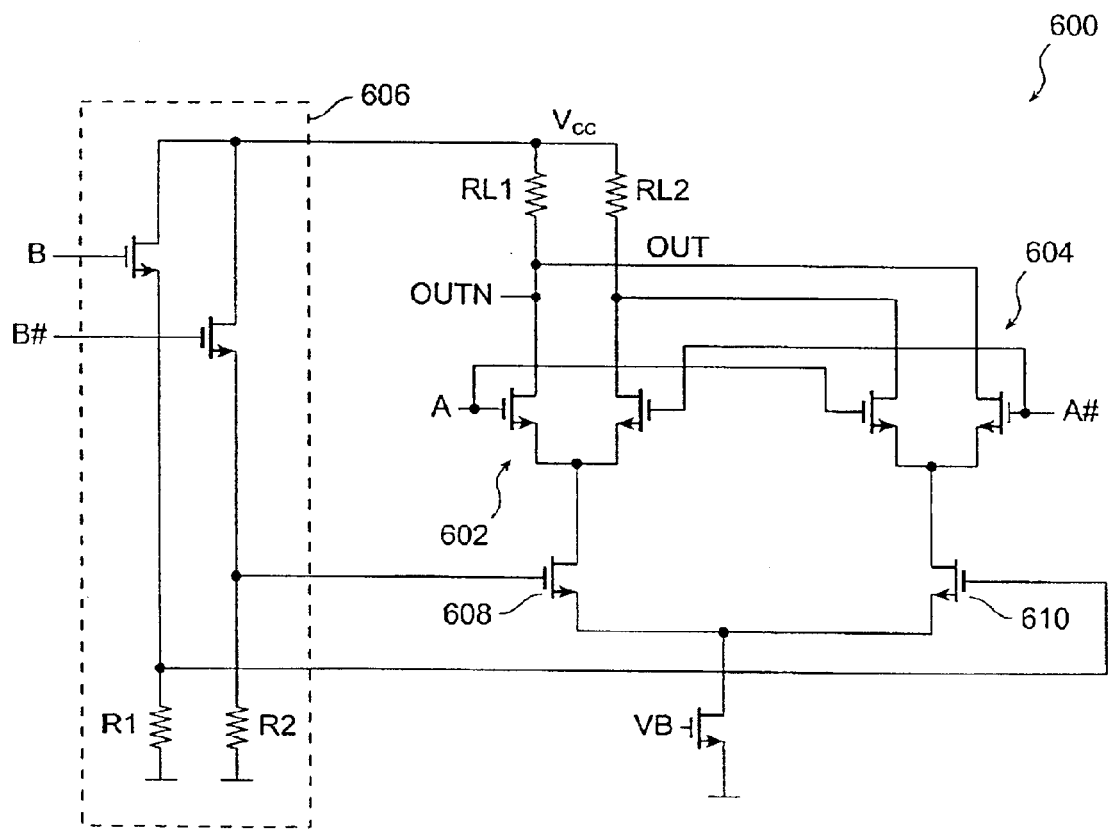
FIG. 6 shows an exemplary C³MOS implementation for a two-input exclusive OR/NOR gate.

FIG. 6 shows an exemplary C³MOS implementation for a two-input exclusive OR (XOR) gate 600. This implementation includes two differential pairs 602 and 606 that share the same resistive load, receive differential signals A and A# at their inputs as shown, and have their drain terminals cross-coupled at the outputs. The other differential input signals B and B# are first level shifted by circuit 606 and then applied to cascode transistors 608 and 610 that are inserted between the differential pairs and the current source transistor. The circuit as thus constructed performs the XOR function on the two input signals A and B.

Figure 7:
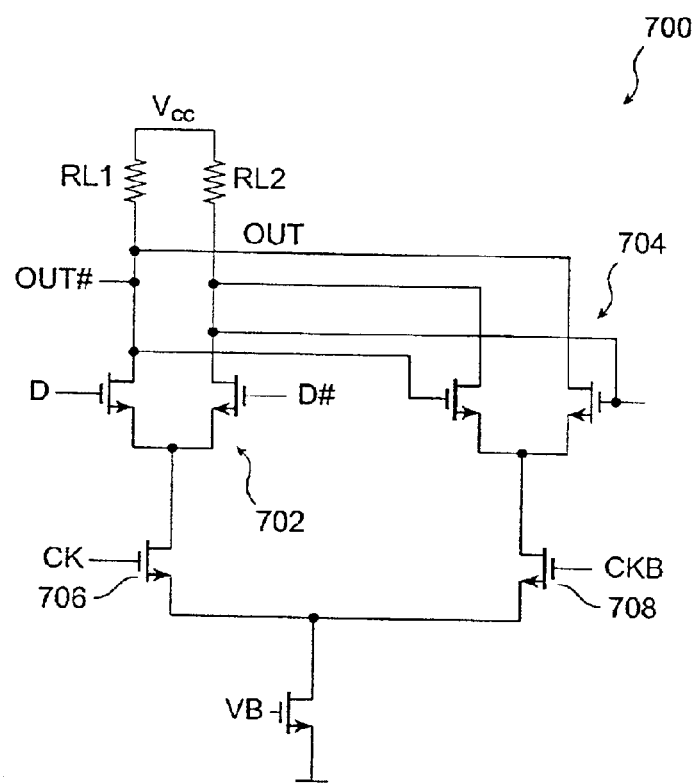
FIG. 7 is a circuit schematic showing an exemplary C³MOS clocked latch according to the present invention.

FIG. 7 is a circuit schematic showing an exemplary C³MOS clocked latch 700 according to the present invention. Latch 700 includes a first differential pair 702 that receives differential inputs D and D# at the gate terminals, and a second differential pair 704 that has its gate and drain terminals cross-coupled to the outputs of OUT and OUT# first differential pair 702. Clocked transistors 706 and 708 respectively connect common-source nodes of differential pairs 702 and 704 to the current-source transistor. Complementary clock signals CK and CKB drive the gate terminals of clocked transistors 706 and 708. Similar to the other C³MOS gates that have additional transistors inserted between the differential pair and the current-source transistor, clock signals CK and CKB are level shifted by level shift circuits such as that of FIG. 3.

Figure 8:
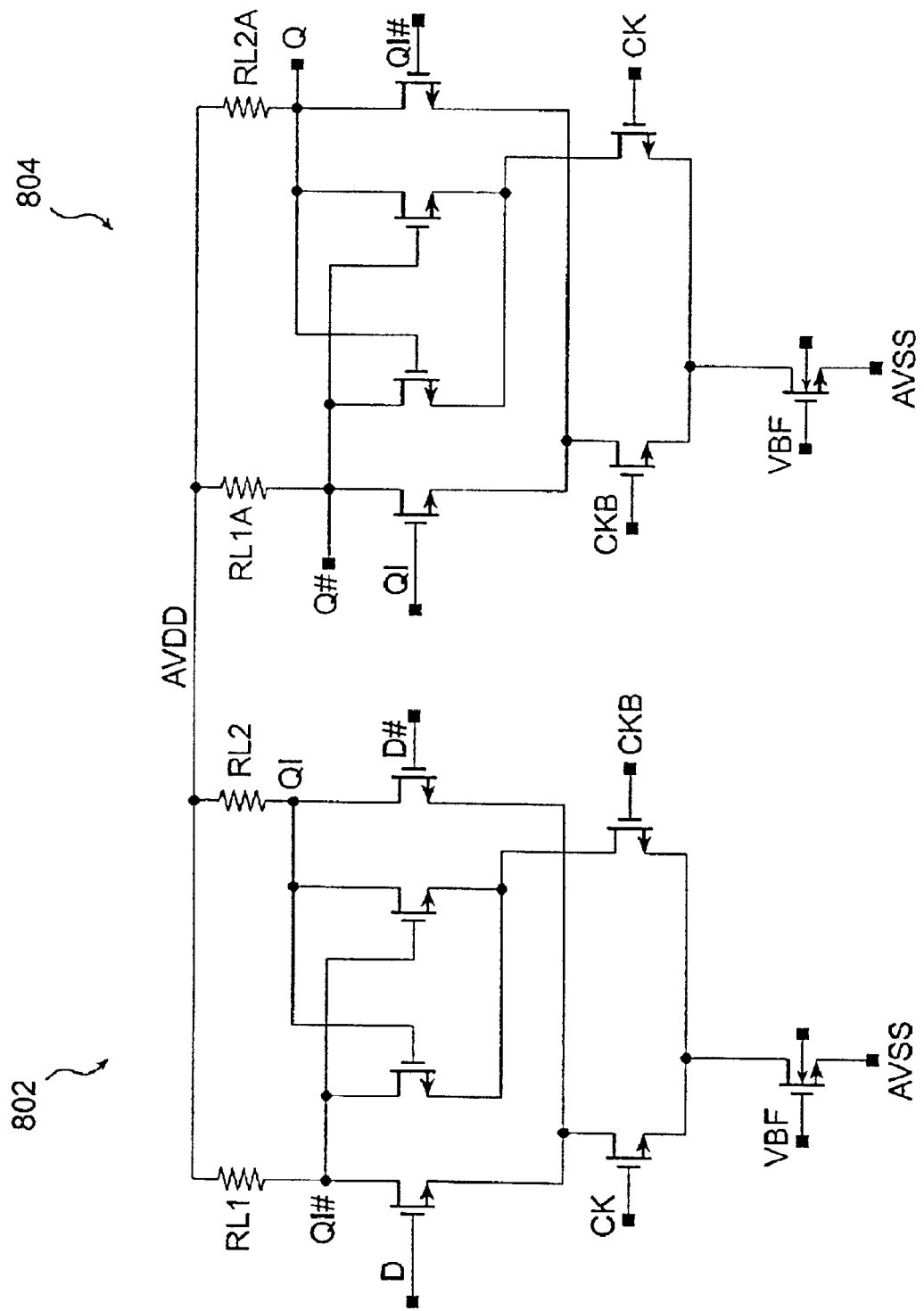
FIG. 8 is a circuit schematic for an alternate embodiment for a C³MOS flip-flop according to the present invention.

A C³MOS master-slave flip-flop 800 according to the present invention can be made by combining two latches 700 as shown in FIG. 8. A first latch 802 receives differential input signals D and D# and generates differential output signals QI and QI#. The differential output signals QI and QI# are then applied to the differential inputs of a second latch 804. The differential outputs Q and Q# of second latch 804 provide the outputs of flip-flop 800.

Figure 9:
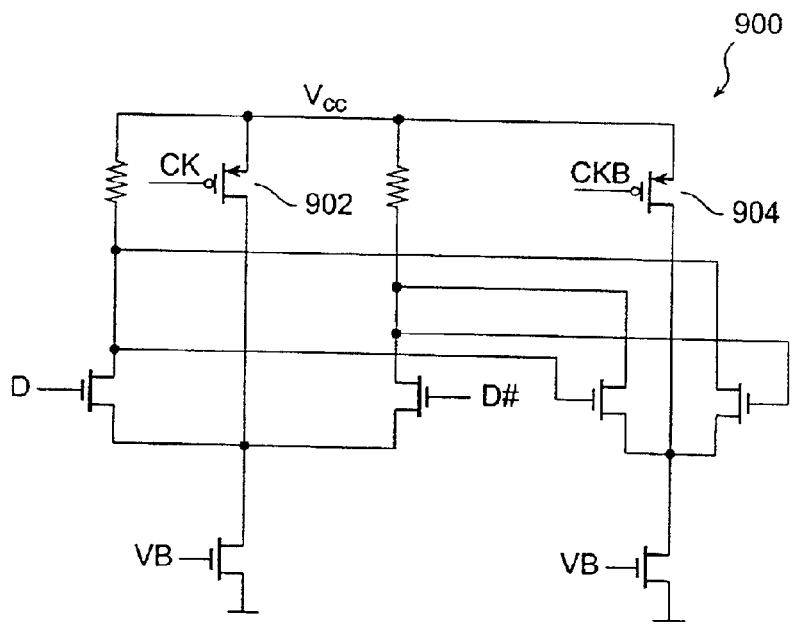
FIG. 9 shows an exemplary C³MOS implementation for a flip-flop using the C³MOS latch of FIG. 7.

Every one of the logic gates described thus far may be implemented using p-channel transistors. The use of p-channel transistors provides for various alternative embodiments for C³MOS logic gates. FIG. 9 shows one example of an alternative implementation for a C³MOS clocked latch 900 that uses p-channel transistors. In this embodiment, instead of inserting the n-channel clocked transistors between the common-source nodes of the differential pairs and the current-source transistor, p-channel clocked transistors 902 and 904 connect between the common-source nodes and the power supply Vcc. This implementation also requires that each differential pair have a separate current-source transistor as shown. Clocked latch 900 operates essentially the same as latch 700 shown in FIG. 7, except the implementation is not as efficient both in terms of size and speed.

Figure 10:
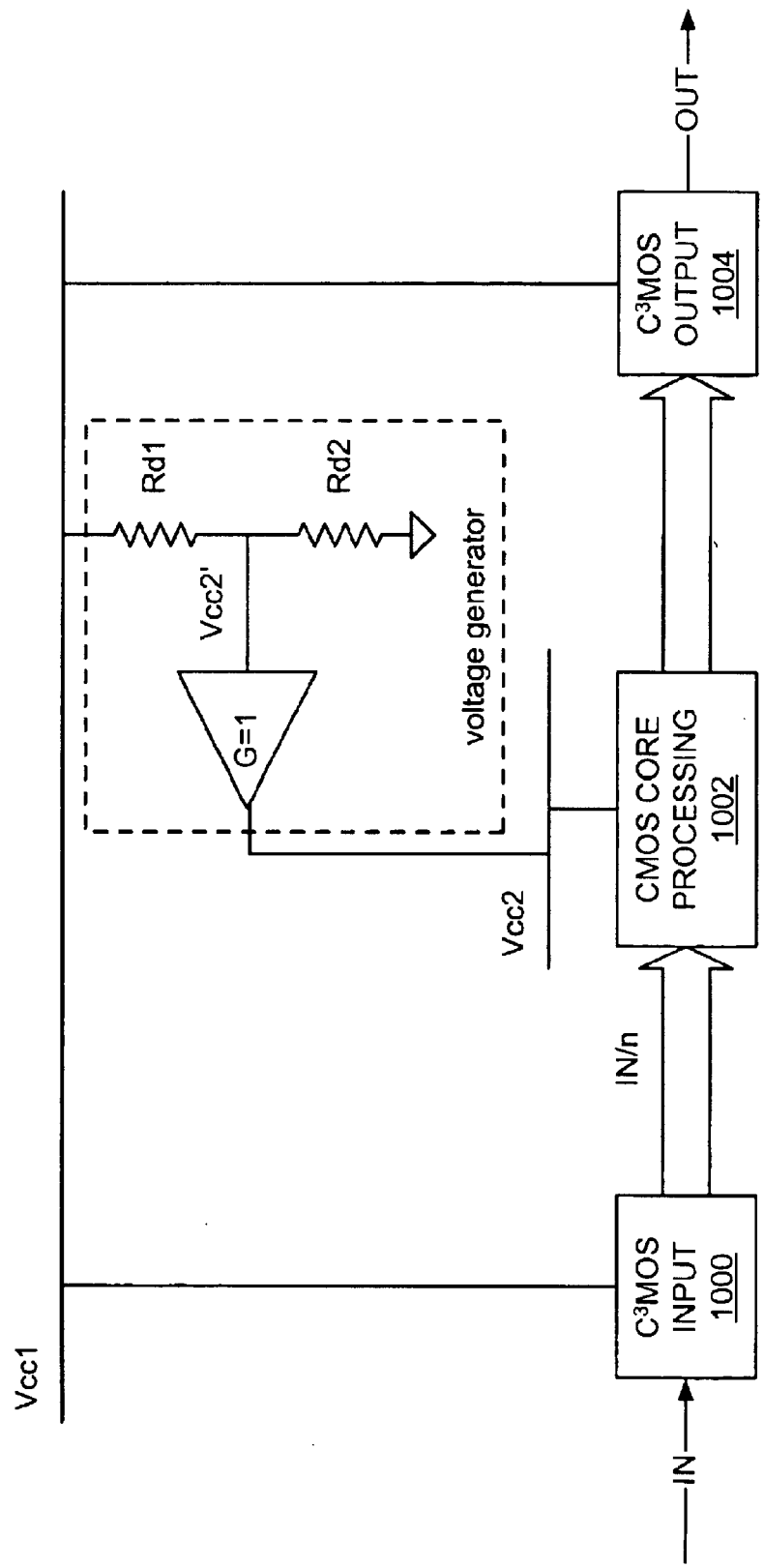
FIG. 10 shows a block diagram for a circuit that combines C³MOS and conventional CMOS logic on a single silicon substrate to achieve optimum tradeoff between speed and power consumption.

As illustrated by the various C³MOS logic elements described above, all of the building blocks of any logic circuitry can be constructed using the C³MOS technique of the present invention. More complex logic circuits such as shift registers, counters, frequency dividers, etc., can be constructed in C³MOS using the basic elements described above. As mentioned above, however, C³MOS logic does consume static power. The static current dissipation of C³MOS may become a limiting factor in certain large scale circuit applications. In one embodiment, the present invention combines C³MOS logic with conventional CMOS logic to achieve an optimum balance between speed and power consumption. According to this embodiment of the present invention, an integrated circuit utilizes C³MOS logic for the ultra high speed (e.g., GHz) portions of the circuitry, and conventional CMOS logic for the relatively lower speed sections. For example, to enable an integrated circuit to be used in ultra high speed applications, the input and output circuitry that interfaces with and processes the high speed signals is implemented using C³MOS. The circuit also employs C³MOS to divide down the frequency of the signals being processed to a low enough frequency where conventional CMOS logic can be used. The core of the circuit, according to this embodiment, is therefore implemented by conventional CMOS logic that consumes zero static current. FIG. 10 shows a simplified block diagram illustrating this exemplary embodiment of the invention. A C³MOS input circuit 1000 receives a high frequency input signal IN and outputs a divided down version of the signal IN/n. The lower frequency signal IN/n is then processes by core circuitry 1002 that is implemented in conventional CMOS logic. A C³MOS output circuit 1004 then converts the processed IN/n signal back to the original frequency (or any other desired frequency) before driving it onto the output node OUT.

Figure 11:
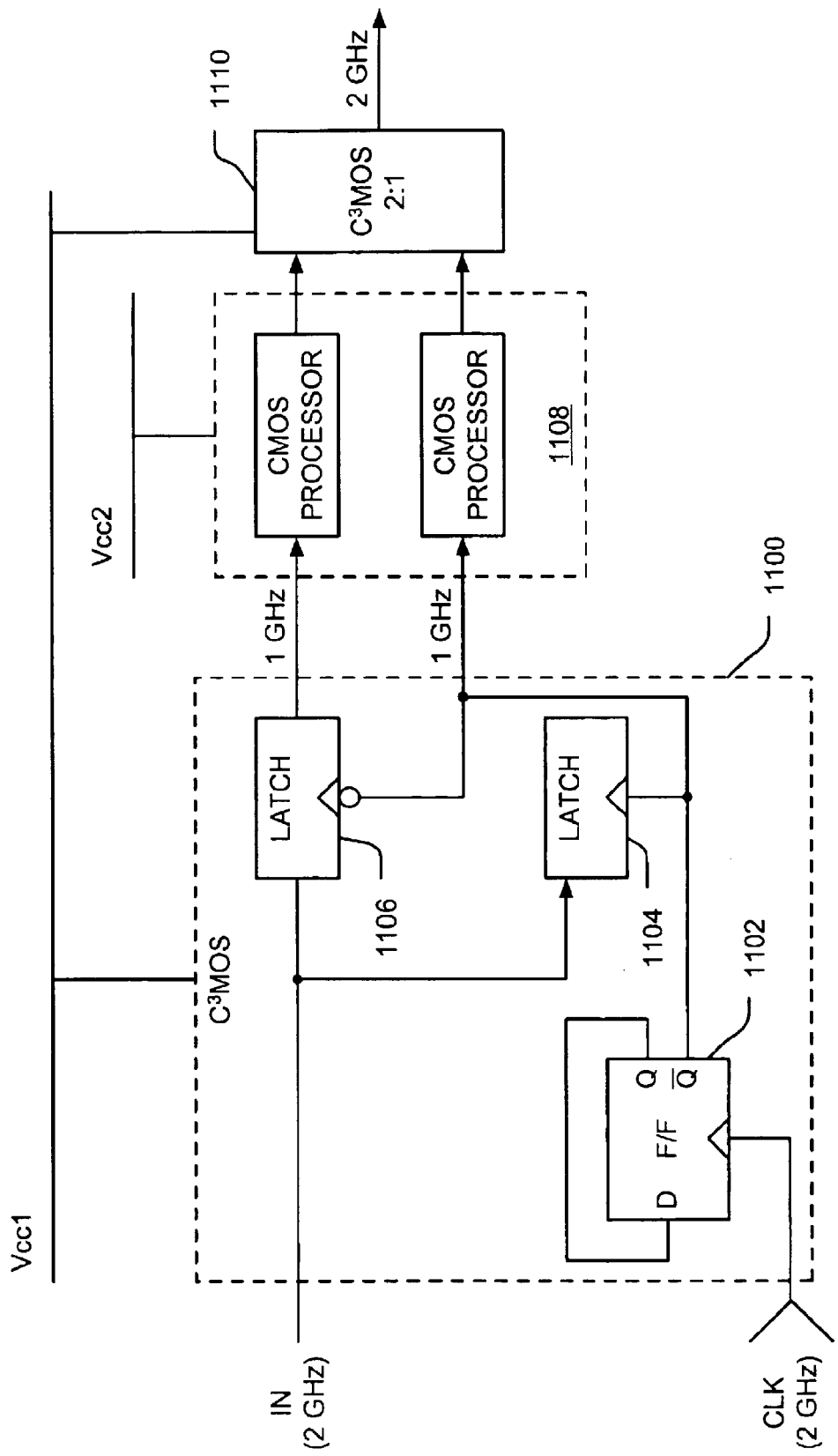
FIG. 11 shows an exemplary circuit application of the C³MOS/CMOS combined logic wherein C³MOS logic is used to deserialize and serialize the signal stream while CMOS logic is used as the core signal processing logic circuitry.

An example of a circuit implemented using combined CMOS/C³MOS logic according to the present invention is shown in FIG. 11. C³MOS input circuitry 1100 is a deserializer that receives a serial bit stream at a high frequency of, for example, 2 GHz. A 2 GHz input clock signal CLK is divided down to 1 GHz using a C³MOS flip-flop 1102, such as the one shown in FIG. 8, that is connected in a ÷2 feedback configuration. The 1 GHz output of flip-flop 1102 is then supplied to clock inputs of a pair of C³MOS latches 1104 and 1106. Latches 1104 and 1106, which may be of the type shown in FIG. 6, receive the 2 GHz input bit stream at their inputs and respectively sample the rising and falling edges of the input bit stream in response to the 1 GHz clock signal CLK/2. The signal CLK/2 which is applied to the B/B# inputs of each latch (the level shifted input; see FIG. 6), samples the input data preferably at its center. It is to be noted that the rise and fall times of the signal in CMOS logic is often very dependent on process variations and device matching. C³MOS logic, on the other hand, is differential in nature and therefore provides much improved margins for sampling.

Referring back to FIG. 11, block 11 thus deserializes the input bit stream with its frequency halved to allow for the use of conventional CMOS logic to process the signals. The signals at the outputs of latches 1104 and 1106 are applied to parallel processing circuitry 1108 that are implemented in conventional CMOS logic operating at 1 GHz. The reverse is performed at the output where a serializer 1110 receives the output signals from processing circuitry 1108 and serializes them using C³MOS logic. The final output signal is a bit stream with the original 2 GHz frequency. Circuit applications wherein this technique can be advantageously be employed include high speed single or multi-channel serial links in communication systems.

As apparent from the circuit shown in FIG. 11, this technique doubles the amount of the core signal processing circuitry. However, since this part of the circuit is implemented in conventional CMOS logic, current dissipation is not increased by the doubling of the circuitry. Those skilled in the art appreciate that there can be more than one level of deserializing if further reduction in operating frequency is desired. That is, the frequency of the input signal can be divided down further by 4 or 8 or more if desired. As each resulting bit stream will require its own signal processing circuitry, the amount and size of the overall circuitry increases in direct proportion to the number by which the input signal frequency is divided. For each application, therefore, there is an optimum number depending on the speed, power and area requirements.

Figure 12:
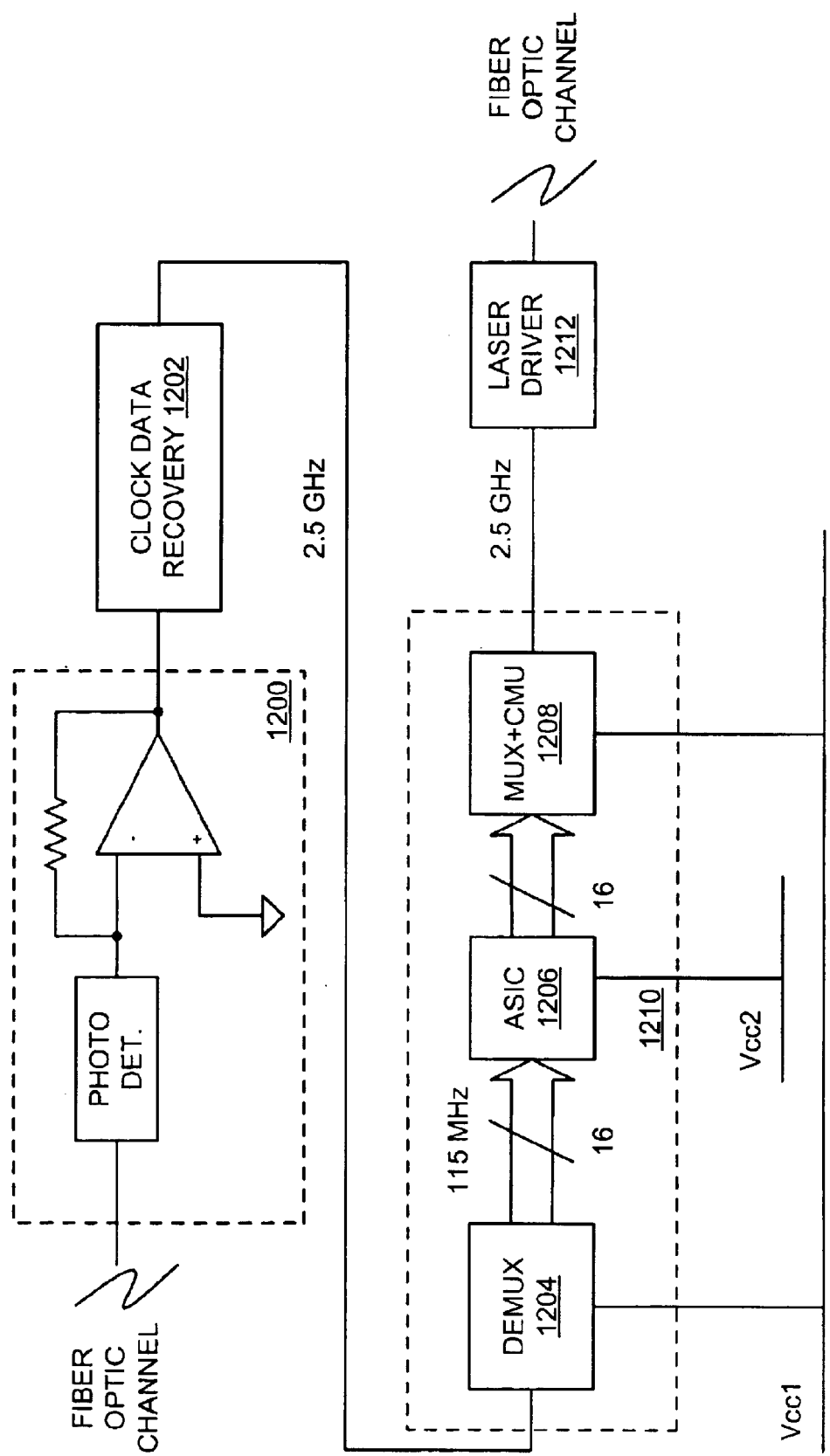
FIG. 12 is a simplified block diagram of a transceiver system that utilizes the C³MOS/CMOS combined logic according to the present invention to facilitate interconnecting high speed fiber optic communication channels.

According to one embodiment of the present invention the combined C³MOS/CMOS circuit technique as shown in FIG. 11 is employed in a transceiver of the type illustrated in FIG. 12. The exemplary transceiver of FIG. 12 is typically found along fiber optic channels in high speed telecommunication networks. The transceiver includes at its input a photo detect and driver circuit 1200 that receives the input signal from the fiber optic channel. Circuit 1200 converts fiber-optic signal to packets of data and supplies it to a clock data recovery (CDR) circuit 1202. CDR circuit 1202 recovers the clock and data signals that may be in the frequency range of about 2.5 GHz, or higher. Established telecommunication standards require the transceiver to perform various functions, including data monitoring and error correction. These functions are performed at a lower frequency. Thus, the transceiver uses a demultiplexer 1204 which deserializes the 2.5 GHz data stream into, for example, 16 parallel signals having a frequency of about 155 MHz. An application specific integrated circuit (ASIC) 1206 then performs the monitoring and error correction functions at the lower (155 MHz) frequency. A multiplexer and clock multiplication unit (CMU) 1208 converts the parallel signals back into a single bit stream at 2.5 GHz. This signal is then retransmitted back onto the fiber optic channel by a laser drive 1212. The combined C³MOS/CMOS technique of the present invention allows fabrication of demultiplexer 1204, ASIC 1206 and multiplexer and CMU 1208 on a single silicon die in a similar fashion as described in connection with the circuit of FIGS. 10 and 11. That is, demultiplexer 1204 and multiplexer and CMU 1208 are implemented in C³MOS with ASIC 1206 implemented in conventional CMOS.

According to another aspect of the present invention circuit speed is further enhanced by using a higher supply voltage for the C³MOS circuitry than that which may be specified by the CMOS fabrication process. The ongoing advances in semiconductor fabrication technology continue to make smaller and faster devices possible. The smaller geometries, however, often limit the voltage tolerance of the transistors. For example, while a thinner gate dielectric in an MOS transistor helps increase its speed of operation, the breakdown voltage at which damage may be caused to the transistor is also lowered. This reliability concern, as well as the desire to reduce power, have resulted in a downward trend in the permissible level of supply voltage for the modem sub-micron CMOS process. The lower power supply voltage, however, reduces the current density of the MOS transistor (i.e., lower transconductance) making the transistor slower. This is worse for CMOS circuitry using C³MOS logic where there are more than two devices stacked between the two power supplies. That is, instead of the two transistors 102 and 104 in the conventional CMOS inverter shown in FIG. 1, a typical C³MOS logic block such as buffer/inverter 200 of FIG. 2 has at least three devices, transistor 212, transistor 202 (or 204) and resistor 206 (or 208) between Vcc and ground. Therefore, buffer/inverter 200 has less voltage across its transistors. It also has a more limited output voltage swing. Moreover, the low voltage differential signaling (LVDS) technique that is often employed in high speed circuits may have a common mode voltage requirement that, for the C³MOS circuitry, would be too high to meet when using a lower power supply voltage.

According to one embodiment of the present invention a CMOS circuit combining both C³MOS logic as well as conventional CMOS logic is operated using two different power supply voltages. The C³MOS logic runs off of a first power supply voltage that is higher than the power supply voltage used for the conventional CMOS logic. The stacked nature of the C³MOS logic structure divides the power supply voltage across at least three stacked devices as opposed to only two. This enables it to receive a supply voltage that is higher than the maximum tolerable for conventional CMOS logic where there are only two devices between the supply rails. For example, today's $0.13\mu$ CMOS process may specify power supply voltages no higher than 1.2 volts. A circuit according to this embodiment of the present invention can run the C³MOS portion off of a higher supply voltage of, e.g., 1.8 volts, while the CMOS portion of the circuit runs off of the prescribed 1.2 volt supply. Because the 1.8 volts is divided between at least one resistor and two transistors (as in the case of the C³MOS buffer/inverter of FIG. 2), the transistors do not experience excessive voltages between their terminals during operation. Also, because C3MOS circuitry typically processes signals with smaller swings, it can withstand the higher supply voltage. The higher power supply voltage greatly improves the speed of the circuit as well as its ability to meet the required LVDS output level.

In an exemplary circuit implementation, a pre-driver signal conditioning circuit is used to maximize the speed of C³MOS logic. The pre-driver drives the inputs of a C³MOS buffer/level shifter of the type shown in FIG. 3. To maximize the switching speed of the input transistors in the C³MOS stage (transistors M1 and M2 of FIG. 3), it is desirable to maintain these transistors operating in the saturation region. One way to accomplish this is to reduce the common mode level of the differential input signal driving the gate terminals of transistors M1 and M2. However, this would mean that with a lower power supply voltage at Vcc, the pre-driver voltage would have to be even lower. A much reduced input signal level would leave very little voltage head-room for the tail transistor M3 requiring a larger M3 which would then add to the size of the circuit as well as the parasitics. By using a higher supply voltage than the maximum specified by the process, the present invention allows the pre-driver to operate at a higher voltage. This allows the input transistors M1 and M2 to remain in the saturation region without the need for a larger trail transistor M3. Depending on the embodiment, the higher voltage operation may push transistors M1 and M2 in deep saturation to even greater speed. As a result, the overall speed of the circuit is much enhanced. In an exemplary embodiment, the pre-driver circuit includes a pair of AC coupling capacitors C1 and C2 respectively connecting to input terminals INP (D input in FIG. 3) and INN (D# input in FIG. 3). A pair of termination resistors RT1 and RT2 connect across the input terminals INP and INN, and a voltage divider made of a pair of resistors Rb1 and Rb2 set the common mode bias voltage for the input signal. Other implementations are possible.

The dual power supply embodiment of the present invention can be implemented in a number of ways. In one embodiment, two separate supply voltages can be applied externally. The higher voltage would be applied to the C³MOS logic circuitry and the lower voltage to the conventional CMOS logic circuitry. This embodiment would require two external pins for the chip. An alternative embodiment receives only one power supply voltage and generates the other on-chip. That is, a circuit could operate with two different supply voltages Vcc1 for C³MOS logic circuitry and Vcc2 for conventional CMOS logic circuitry. A voltage generator receives Vcc1 and generates the second supply voltage Vcc2 for use with conventional CMOS logic circuitry. A variety of circuit implementations are known for a voltage generator. One example of a circuit implementation for a voltage generator includes a voltage divider made up of resistors Rd1 and Rd2 that connect between the first power supply voltage Vcc1 and ground. Resistors Rd1 and Rd2 are sized to generate the desired second voltage level Vcc2'. An amplifier connected in a unity gain configuration provides a buffer between the divider and the output Vcc2 that is to be used by the conventional CMOS logic circuitry.

In conclusion, the present invention provides various circuit techniques for implementing ultra high speed circuits using current-controlled CMOS (C³MOS) logic fabricated in conventional CMOS process technology. An entire family of logic elements including inverter/buffers, level shifters, NAND, NOR, XOR gates, latches, flip-flops and the like have been developed using C³MOS according to the present invention. In one embodiment, the present invention advantageously combines high speed C³MOS logic with low power conventional CMOS logic. According to this embodiment circuits such as transceivers along fiber optic channels can be fabricated on a single chip where the ultra-high speed portions of the circuit utilize C³MOS and the relatively lower speed parts of the circuit use conventional CMOS logic. In another embodiment, the C³MOS logic circuitry receives a first power supply voltage that is higher than the power supply voltage used by the conventional CMOS logic circuitry. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A metal-oxide-semiconductor field-effect transistor (MOSFET) circuit fabricated on a silicon substrate, comprising:

first circuitry implemented using current-controlled complementary metal-oxide semiconductor (C³MOS) logic wherein differential logic levels are signaled by current steering in one of two or more branches in response to differential logic signals, the first circuitry being configured to process a first signal having a first frequency;

second circuitry coupled to the first circuitry and implemented using conventional complementary metal-oxide-semiconductor (CMOS) logic wherein substantially zero static current is dissipated, wherein, the first circuitry is coupled to a first power supply voltage and the second circuitry is coupled to a second power supply voltage that is different than the first power supply voltage;

wherein the first circuitry comprises an input circuit that is implemented using the C³MOS logic, and is configured to deserialize the first signal into a plurality of lower frequency signals; and wherein the second circuitry comprises conventional CMOS logic that is configured to process the plurality of lower frequency signals to generate a plurality of lower frequency processed signals.

2. The circuit of claim 1 wherein the first power supply voltage is higher in magnitude than the second power supply voltage.

3. The circuit of claim 2 wherein the second power supply voltage is the maximum power supply voltage specified by CMOS process used to fabricate the circuit.

4. The circuit of claim 1 wherein the second power supply voltage is generated on-chip from the first power supply voltage.

5. The circuit of claim 4 further comprising a voltage generator coupled to the first power supply voltage and configured to generate the second power supply voltage.

6. The circuit of claim 1 wherein the first circuitry comprises one or more $C^3MOS$ logic stages, wherein a $C^3MOS$ logic stage comprises at least three components including an input transistor coupled between a load device and a tail transistor that are stacked between the first power supply voltage and a lower potential.

7. The circuit of claim 6 wherein the first circuitry further comprises a pre-driver coupled to an input of a $C^3MOS$ logic stage, and configured to bias an input signal to the $C^3MOS$ logic stage for enhancing speed of operation of the $C^3MOS$ logic stage.

8. The circuit of claim 7 wherein the pre-driver reduces a common mode voltage level of the input signal.

9. The circuit of claim 1 wherein the second circuit comprises a plurality of substantially identical CMOS Circuits that respectively process the plurality of lower frequency signals and generate an output signal that comprises a plurality of lower frequency processed signals.

10. The circuit of claim 1 further comprising a third circuitry implemented using $C^3MOS$ logic, that receives the plurality of lower frequency processed signals from the second circuit, and is configured to serialize the plurality of lower frequency processed signals into a second signal having the first frequency.

11. A metal-oxide-semiconductor field-effect transistor (MOSFET) circuit comprising:
   a first circuit implemented using current-controlled complementary metal-oxide semiconductor ($C^3MOS$) logic wherein differential logic levels are signaled by current steering in one of two or more branches in response to differential logic signals, the first circuit receiving a first power supply;
   a second circuit coupled to the first circuit and implemented using conventional complementary metal-oxide-semiconductor (CMOS) logic wherein substantially zero static current is dissipated, the second circuit receiving a second power supply voltage that is lower in magnitude than the first power supply; and
   a third circuit coupled to the second circuit and implemented using $C^3MOS$ logic, the third circuit receiving the first power supply.

12. The MOSFET circuit of claim 11 further comprising a voltage generator coupled to receive the first power supply voltage and configured to generate the second power supply voltage.

13. The MOSFET circuit of claim 11 wherein the first circuit comprises a deserializer that receives the first logic signal having the first frequency and, using a clock signal, generates the second logic signal comprising N logic signals having a second frequency that is lower than the first frequency, where N is an integer greater than one.

14. The MOSFET circuit of claim 13 wherein the second circuit comprises N substantially identical CMOS circuits that respectively process the N signals and generate a second output signal, the second output signal comprising N processed signals.

15. The MOSFET circuit of claim 14 wherein the third circuit comprises a serializer that receives the N processed signals and converts the N processed signals into the third output signal.

16. The MOSFET circuit of claim 15 wherein the second circuit comprises core transceiver circuitry.

17. A method for processing high speed signals using silicon complementary metal-oxide-semiconductor (CMOS) technology, the method comprising:
   receiving the high speed signal at a first circuit that uses current-controlled complementary metal-oxide semiconductor ($C^3MOS$) logic wherein logic levels are signaled by current steering in one of two or more branches in response to differential logic signals;
   powering the first circuit using a first power supply voltage;
   converting the high speed signal into a lower frequency signal;
   processing the lower frequency signal by a second circuit that uses standard CMOS logic wherein substantially zero static current is dissipated; and
   powering the second circuit using a second power supply voltage that is smaller in magnitude than the first power supply voltage.

18. The method of claim 17 wherein the step of converting comprises deserializing the high speed signal into a plurality of lower frequency signals.

19. The method of claim 17 further comprising generating the second power supply voltage from the first power supply voltage.

* * * * *